United States Patent [19]
Kim

[11] Patent Number: 5,952,608
[45] Date of Patent: Sep. 14, 1999

[54] FINGER STRIP FOR SHIELDING ELECTROMAGNETIC WAVE AND FRONT PANEL ASSEMBLY MOUNTING THE SAME

[76] Inventor: Sun-Ki Kim, 105-403, Lucky APT. 570, Hogae-dong, Dongan-gu, Anyang, Kyonggi-do, Rep. of Korea

[21] Appl. No.: 08/909,158

[22] Filed: Aug. 11, 1997

[51] Int. Cl.[6] .................................................. H05K 9/00
[52] U.S. Cl. ....................................................... 174/35 GC
[58] Field of Search .................................. 361/816, 818; 174/35 R, 35 GC; 439/609, 927; 220/681

[56] References Cited

U.S. PATENT DOCUMENTS

| | | | |
|---|---|---|---|
| 4,760,214 | 7/1988 | Bienia et al. | 174/35 GC |
| 5,004,866 | 4/1991 | Cooke et al. | 174/35 GC |
| 5,233,507 | 8/1993 | Gunther et al. | 361/818 |
| 5,746,326 | 5/1998 | Hong | 211/41.17 |

Primary Examiner—Dean A. Reichard
Assistant Examiner—Hung V Ngo
Attorney, Agent, or Firm—Dann, Dorfman, Herrell and Skillman; Henry H. Skillman

[57] ABSTRACT

A clip-on finger strip including a common base having a predetermined width and length; and a plurality of fingers each having a supporting unit which is connected by placing a first connecting part at one end of the common base and is prolonged to the other end of the common base, an escape preventing unit which is prolonged to the supporting unit, an elastic contact part which is connected by placing a second connecting part at one end of the common base and is prolonged to the other end of the common base, and a height maintaining unit which is prolonged to the elastic contact part, which prevents the transformation of the finger strip even if the module mounting the above finger strip is frequently inserted/drawn out into/from the sub rack and enhances shielding effect between the modules by maintaining a proper height.

8 Claims, 6 Drawing Sheets

FINGER STRIP FOR SHIELDING ELECTROMAGNETIC WAVE AND FRONT PANEL ASSEMBLY MOUNTING THE SAME

BACKGROUND OF THE INVENTION

1. Field of the Invention

The present invention relates to a finger strip for shielding electromagnetic wave and a front panel assembly mounting the same, and particularly to a clip-on finger strip which is located at front panels of modules inserted in the sub rack of communication facilities and is capable of preventing leakage/permeation of electromagnetic wave from/to joints between the panels, and a front panel assembly using the clip on finger strip.

2. Description of the Related Art

Nowadays, as electronic communication industries are developed and information society is established, the electric home appliances, industrial electric apparatuses and info-communication facilities are miniaturized in size. Moreover, in compliance with the request for economy of electric power, many facilities are installed in a small space, as facilities themselves are miniaturized and circuits are integrated. Accordingly, it is apt to be influenced by the noise of electric wave, and many counterplans are considered to solve this problem.

Main parts of facilities in which electromagnetic wave is easily leaked/permeated are connecting parts of the facilities, cables, transparent display plates, connectors, etc. To shield the electromagnetic wave caused by the cable, it is possible to shield the cable itself, or wire inside of the cable, i.e., core which is twisted can be used. Moreover, to shied the electromagnetic wave which is leaked to transparent display plate, the transparent display plate is made of transparent insulated materials, or metal fabric mesh or conductive mesh is provided inside of the transparent display plate. Also, it is possible to shield the electromagnetic wave by the vacuum evaporation of the conductive material at one side of the transparent display plate.

As shown above, it is possible to shield the electromagnetic wave to some degree. However, it is not easy to shield the electromagnetic wave in the connecting parts.

In the connecting parts, shielding of the electromagnetic wave is directed to prevent electric wave generated from outside from being permeated inside of the facility through air, or to prevent the electromagnetic generated inside of the facility from being leaked outside. Though it is proper to design the connecting parts of the facility without joints to shield the electromagnetic wave, it is actually impossible not to have joints in the connecting parts. Accordingly, the permeation or leakage of the electromagnetic wave in the connecting part of the facility is inevitable, and thereby shields are provided between the joints to prevent the permeation or leakage.

Generally, in exchanges, transmission equipments, or communication facilities, when establishing a system, it is common to add modules by considering the extension possibility in the case that the demand is increased. At this time, it is important to maintain a proper interval between the modules, and to prevent the permeation or leakage of the electromagnetic wave through the joints between the modules. That is, in the case of inserting modules in the whole sub rack, when a proper interval is not maintained between the modules, modules inserted later are pressed due to the narrow space to be inserted into. Moreover, in the case of permeation or leakage caused by the absence of shields in cracks between the modules, malfunction occurs as the external devices or the extension board in sub track is influenced.

The interval between the modules is usually decided by the interval between the front panels, and the front panel generally includes a front part and side wall parts which are formed vertically at both ends. Accordingly, to establish the shields in the cracks between the front panels, it is common to locate the shield at one side wall part out of both side wall parts and to insert it into the sub rack. At this time, the height of the shield should be properly maintained to keep a proper interval between the front panels. Moreover, it is also important to provide the shield which does not easily change its shape and has a proper height, though the modules are inserted and drawn out frequently.

Figure 1A:
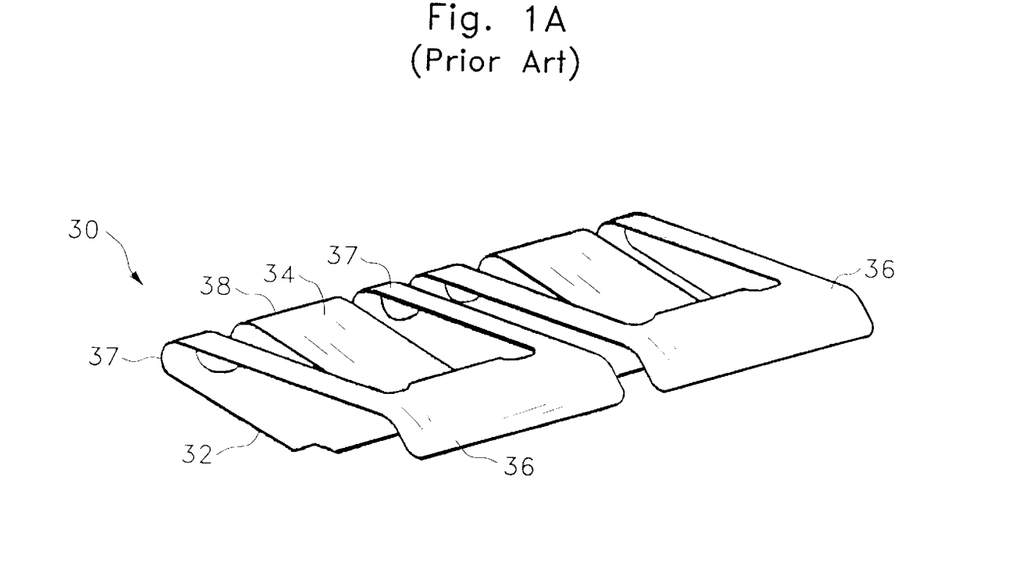
FIG. 1A is a perspective view of a conventional finger strip for shielding the electromagnetic wave.
Figure 1B:
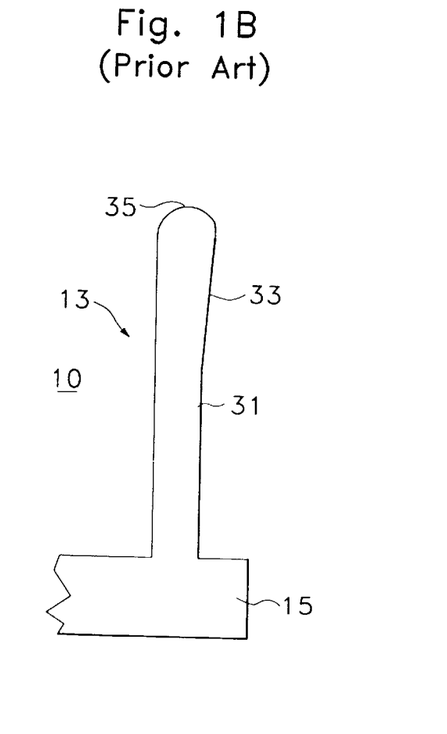
FIG. 1B is a sectional view showing a conventional front panel at which the finger strip of FIG. 1A is fixed.
Figure 1C:
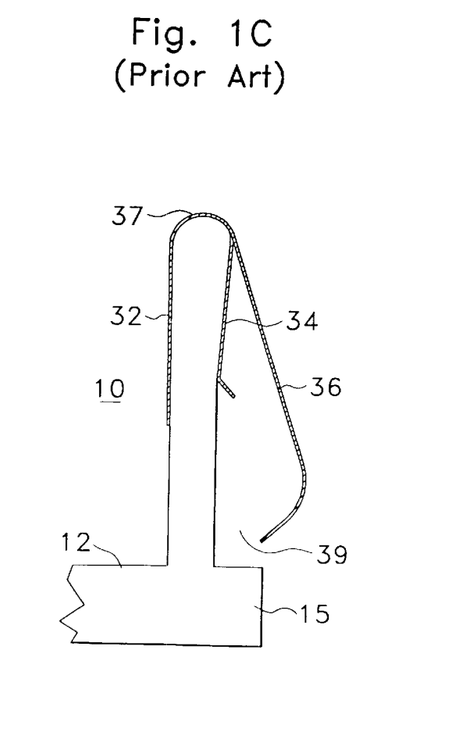
FIG. 1C shows a conventional finger strip and a front panel assembly mounting the same.

FIGS. 1A to 1C show an example of a conventional clip-on finger strip and fixing structure of the front panels. Referring to FIG. 1A, there is shown one part of the clip-on finger strip. Actually, a plurality of finger strips are connected to each other through common base part. Here, only one part is explained. As shown in the drawing, an elastic contact part 36 is separately extended from a base unit 32 through a first connecting part 38, and a supporting unit 34 is separately extended from the base unit 32 through a second connecting part 37.

The base unit 32, the first connecting part 38 and the supporting unit 34 are shaped like a clip, and they are designed to locate at a finger strip. Accordingly, the first connecting part 38 is operated as a spring plate having a restoring force which intends to move in a first direction. Moreover, the base unit 32, the second connecting part 37 and the elastic contact part 36 are shaped like a pincette, and they are designed to absorb shock against the external force. Accordingly, the second connecting part 37 is operated as a spring plate having a restoring force which intends to move in a second direction opposite to the direction of the first connecting part 38.

The front panels for locating the finger strip having the above-described structure are explained. The side wall part 13 of the front panel 10 includes a first part 31 having a predetermined thickness shown in FIG. 1B, a second part 33 having a thickness which is more extended from the first part, and an end part 35 having a predetermined curvature. The end part 35 has a same curvature with the first connecting part 38 of the corresponding finger strip. Also, a projection 15 is provided at the border of the front part of the front panel 10 and the side wall part 13 in the prolonged direction of the front part.

The method for shielding the electromagnetic wave using the front panel having the above-described structure and the finger strip assembly is illustrated referring to FIG. 1C. As shown in the drawing, the first connecting part 38 of the finger strip is contacted on the end part 35 of the front panel 10 and inserted into the end part 35 by pressure. At this time, the first connecting part 38 is widened and it is proceeded along the side wall part 13. As the thickness of the second part 32 of the side wall part 13 is gradually decreased, the restoring force of the first connecting part 38 is operated, and thereby the clip-shaped part of the finger strip is tightly fixed to the second part 33 of the side wall part 13. After inserting the module in which finger strips are provided at its front panels into the sub rack, adjacent modules are inserted again. At this time, the side wall part 13 in which the finger strip of adjacent module is not located is inserted, by pushing the elastic contact part 36 into a space 39 formed by the projection 15. After insertion, the restoring force by the second connecting part 37 is carried to the side wall part of the adjacent module. As a result, it is possible to have a proper interval between the modules and not to move the adjacent modules, and thereby the leakage of the electromagnetic wave between the modules is shielded.

However, the conventional clip-on finger strip has several problems. First, when the adjacent module is inserted in the sub rack, the elastic contact part is not pushed inside of the space part and it has a 180° turn by the force of the inserting direction of the module. In the case that the module is inserted without sensing this state, the effect of the shielding is decreased. Moreover, although the elastic contact part is restored to the original state by sensing the present state, as the height of the elastic contact part is not the same as other elastic contact parts, the above-mentioned problem can arise in the case of inserting the module again after drawing it out. That is, when the height of the elastic contact part which is restored to the original state is lower than that of other elastic contact parts, the shielding is inefficient. On the contrary, in the case the height is larger than that of other elastic contact parts, it has a 180° turn. Additionally, as this operation is repeated, the second connecting part is broken and a new finger strip should be replaced.

Second, there is a problem in that the clip-shaped part of the finger strip is slipped out of the side wall by the force of the inserting direction of the module. At this time, the elastic contact part of the finger strip is not pushed inside of the space part, and it is not lifted up. In this case, it is necessary to draw out the module and to locate the finger strip again.

SUMMARY OF THE INVENTION

Therefore, it is an object of the present invention to provide an improved finger strip capable of being stably mounted at the front panel.

It is another object of the present invention to provide a finger strip and a front panel assembly mounting the same having an elastic contact part which is difficult to change when inserting the module in the sub rack.

It is another object of the present invention to provide a finger strip and a front panel assembly mounting the same capable of being easily restored to a state having same height as other elastic contact parts, in the case that the elastic contact part of the finger strip is changed.

To achieve the above-mentioned objects, the clip-on finger strip according to the present invention includes a common base having a predetermined width and length; and a plurality of fingers each having a supporting unit which is connected by placing a first connecting part at one end of the common base and is prolonged to the other end of the common base, an escape preventing unit which is prolonged to the supporting unit, an elastic contact part which is connected by placing a second connecting part at one end of the common base and is prolonged to the other end of the common base, and a height maintaining unit which is prolonged to the elastic contact part.

In order to fix the extension board of the extended modules and to mount the finger strips for shielding the electromagnetic wave, the finger strip includes a common base having a predetermined width and length; and a plurality of fingers each having a supporting unit which is connected by placing a first connecting part at one end of the common base and is prolonged to the other end of the common base, an escape preventing unit which is prolonged to the supporting unit, an elastic contact part which is connected by placing a second connecting part at one end of the common base and is prolonged to the other end of the common base, and a height maintaining unit which is prolonged to the elastic contact part.

The front panel includes a front part; a first side wall part which is formed at one end of the front part; and a second side wall part having a strip escape preventing unit including a fixing body which is formed at the other end of the front part and is actually perpendicular to the front part and a recess which is formed at the fixing body and having a strip height fixing unit which is prolonged parallel to the front part and forms a predetermined space part together with the fixing body.

The common base, the first and second connecting parts, and the supporting unit are inserted into the fixing body, and the escape preventing unit is received by the recess. Moreover, the height maintaining unit is received by the strip height fixing unit.

BRIEF DESCRIPTION OF THE DRAWINGS

The above object and advantages of the present invention will be more clearly understood from the following detailed description taken in conjunction with the accompanying drawings, in which.

DETAILED DESCRIPTION OF THE PREFERRED EMBODIMENTS

The objects, characteristics and advantages of the above-described invention will be more clearly understood referring to the attached drawings.

Figure 2A:
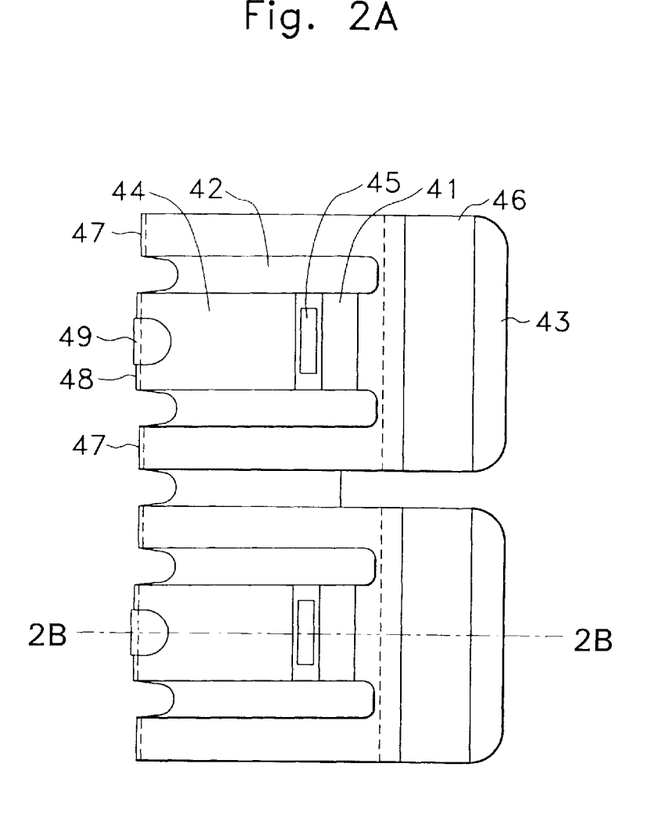
FIG. 2A is a plan view of a finger strip according to the present invention.
Figure 2B:
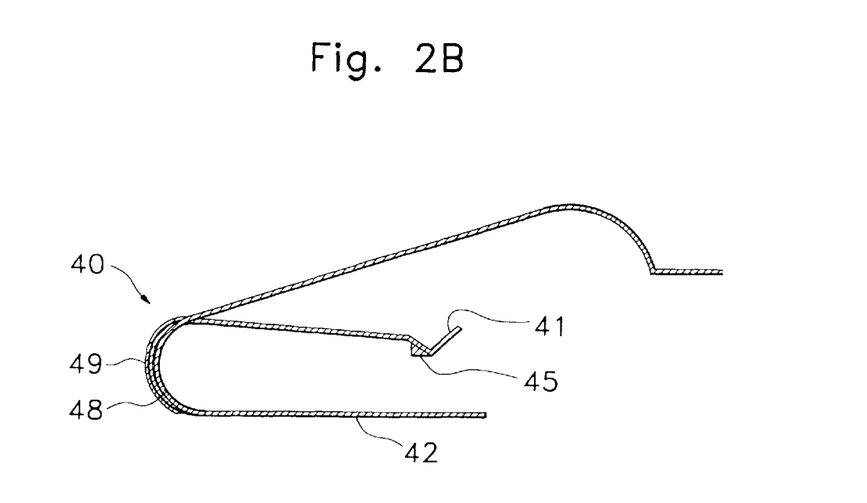
FIG. 2B is a sectional view of the finger strip according to the present invention.

FIG. 2A is a plan view of one embodiment of the finger strip according to the present invention, and FIG. 2B is a sectional view of the finger strip which is cut along a line 2B—2B of FIG. 2A. Actually, a plurality of finger strips are connected to each other through common base part. Here, only one part is explained for illustrative purpose.

Referring to FIGS. 2A and 2B, a finger strip 40 according to the present invention includes an elastic contact part 46 which is separately prolonged from a base unit 42 through a first connecting part 48 and a supporting unit 44 which is also separately prolonged from the base unit 42 through a second connecting part 47.

The base unit 42, the first connecting part 48 prolonged from the base unit 42, and the supporting unit 44 prolonged from the first connecting part 48 are shaped like a clip and they are fixed at the finger strip. In one embodiment, the first connecting part 48 is located between a pair of second connecting parts 47. It is also possible to exchange positions of the first connecting part 48 and the second connecting part 47. The first connecting part 48 has a predetermined curvature, and preferably, a projection 49 for increasing elasticity is formed on the surface of the first connecting part 48. The projection 49 for increasing elasticity can be formed by coining the first connecting part 48, or it can be newly attached to the first connecting part 48. The first connecting part 48 is operated as a spring plate having a restoring force moving in a first direction, and it has a stronger restoring force by the operation of the projection 49 for increasing elasticity. Moreover, the supporting unit 44 is prolonged from the first connecting part 48 so that the distance to the common base 42 is gradually decreased. A folding part 41 is formed at a predetermined position near the edge of the supporting unit 44. At the outer surface of the folding part 41, a stopper 45 is projected. The stopper 45 can be formed by pressing the folding part 41 to be projected toward the common base, or it can be newly attached to the folding part 41.

The base unit 42, the second connecting part 47 prolonged from the base unit 42, and an elastic contact part 46 prolonged from the second connecting part 47 are shaped like a pincette, and they are designed to absorb shock against the external force. The second connecting part 47 has the same curvature as the first connecting part 48, and the elastic contact part 46 is prolonged from the second connecting part 47 so that the distance to the base unit 42 is gradually increased. Accordingly, the second connecting part 47 is operated as a spring plate having a restoring force moving in a second direction which is opposite to the direction of the first connecting part 48. In the finger strip according to the present invention, the end of the elastic contact part 46 has a predetermined curvature, and a guide unit 43 is prolonged from the elastic contact part 46. The guide unit 43 has a predetermined length and has a predetermined angle capable of being matched with the shape of a guide projection of a front panel, which will be illustrated.

Figure 3:
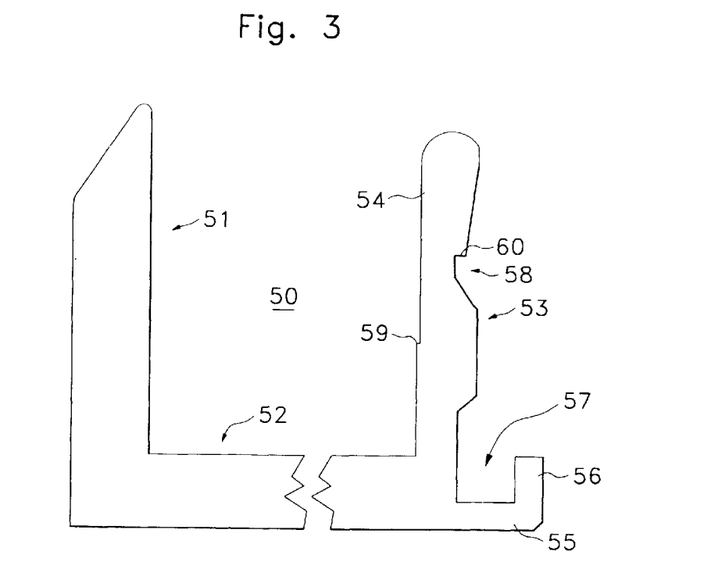
FIG. 3 is a sectional view of a front panel according to the present invention.

Referring to FIG. 3, there is shown an embodiment of front panel having a proper structure capable of fixing the finger strip according to the present invention. As shown in FIG. 3, a front panel 50 includes a front part 52, a first side wall part 51, and a second side wall part 53.

At the front part 52, many display units showing the operating state of the modules and input/output terminals are formed. The first side wall part 51 is vertically prolonged from one end of the front part 52, and as the length of the outer side is shorter than the inner side, the cross section of the end has a shape of scraper.

The second side wall part 53 is vertically prolonged to the other end of the front part 52. It has a strip escape preventing unit and a strip height fixing unit.

The strip escape preventing unit receives the clip-shaped portion of the finger strip so that it cannot be escaped, and it is formed vertically to the front part 52. The strip escape preventing unit has a fixing body 54 and a recess 58 which is formed on the outer surface of the fixing body and has a step 60 having a predetermined height at one end. The end of the fixing body 54 has a similar curvature as the first and second connecting parts. Moreover, a rake angle is provided to form a step 59 at a position corresponding to the base unit of the finger strip on the inner side of the fixing body 54. Moreover, the outer surface from the end of the fixing body 54 to the recess 58 has a predetermined rake angle and the thickness of the body is gradually decreased. The shape of the recess 58 can be varied to other forms providing it can set the stopper or the folding part of the finger strip therein. Preferably, it can be formed to attach the folding part of the finger strip and the edge to the fixing body. In this case, the thickness of the fixing body can be varied.

The strip height fixing unit is actually prolonged parallel to the front part 52, and it includes a guide unit 55 and a guide projection 56 which is vertically formed to the guide unit 55. Accordingly, a predetermined space part 57 is formed by the fixing body 54 of the strip escape preventing unit, the guide unit 55 of the strip height fixing unit, and the guide projection 56.

Figure 4A:
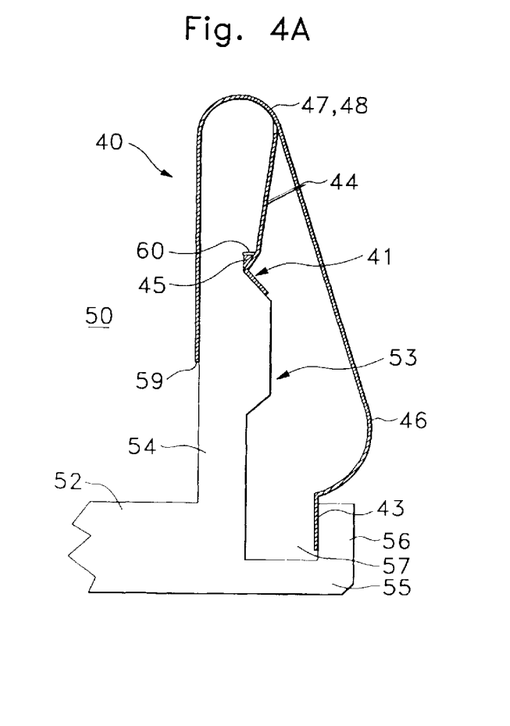
FIG. 4A is a sectional view showing the fixation of the finger strip and the front panel according to the present invention.
Figure 4B:
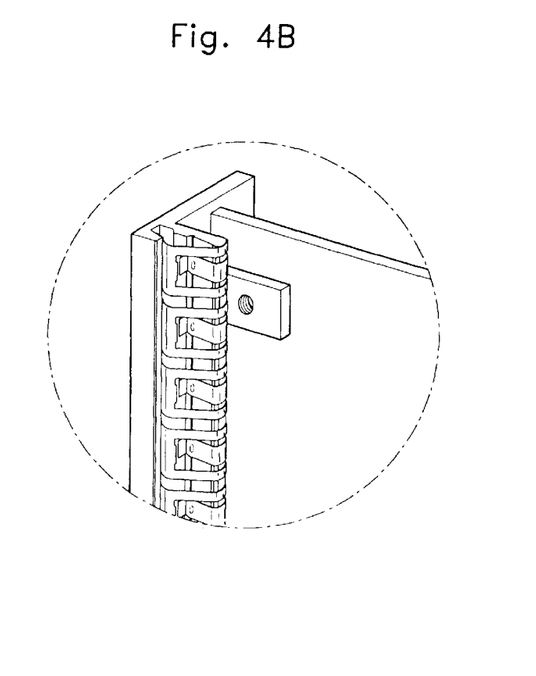
FIG. 4B is a perspective view showing the fixation of the finger strip and the front panel according to the present invention.

Referring to FIGS. 4A and 4B, the method for fixing the finger strip according to the present invention at the front panel will be described.

First, when the end of the fixing body 54 of the second side wall part 53 of the front panel 50 faces toward a predetermined space between the supporting unit 44 and the base unit 42 of the finger strip 40, and external force is pressed, the interval between the base unit 42 and the supporting unit 44 is widened, and the finger strip is inserted along with the fixing body 54 of the second side wall part 53. At this time, after inserting the finger strip to some degree and the elastic contact part 46 of the finger strip is pressed, and then the first and second connecting parts of the finger strip are inserted until they are contacted with the end of the fixing body 54.

The structure after completing the insertion will be explained. First, the guide unit 43 of the finger strip 40 is completely inserted into the space part 57 under the guide projection 56. Although the restoring force by the second connecting part 47 affects the guide unit 43, the guide unit 43 which is hindered by the guide projection 56 is eventually facing with the guide projection 56 by a predetermined force. Moreover, the folding part 41 which is formed at the supporting unit 44 of the finger strip is completely received by the recess 58 of the fixing body 54, and the stopper 45 is hooked by the step 60 of the recess 58.

The effect of the finger strip according to the present invention and the front panel structure mounting the same will be explained in detail.

First, when adjacent modules are inserted, the clip-shaped part of the finger strip according to the present invention can prevent the escape of the finger strip, as the folding part formed at the supporting unit 44 is fixed at the recess formed at the fixing body 54 of the second side wall part of the front panel. The effect is enhanced by the operation of the stopper formed at the folding part. Selectively, a rake angle can be formed so that a predetermined step is formed on the inner surface of the fixing body. After that, by placing the base unit of the finger strip at this rake angle, the finger strip is more stably fixed to the fixing body of the front panel.

Moreover, as the guide unit of the finger strip is arranged by pressing the guide projection of the second side wall part at a predetermined force, the elastic contact part of the finger strip always has a regular and same height H. In the case of inserting adjacent modules, as the guide unit is actually fixed by the guide projection, a 180° turn caused by the lift of the elastic contact part can be prevented. Moreover, in the case that the guide unit is escaped, when the guide unit is inserted under the guide projection again, a predetermined force by the restoring force pushes the guide projection, thereby maintaining a predetermined height and enhancing the shielding effect.

In the first side wall part of the front panel, as the length of the outer side is shorter than that of the inner side, the cross section of the end is shaped like a scraper. At this time, in the case of inserting module, the friction between the end and the elastic contact part of the finger strip of inserted adjacent module can be minimized, thereby minimizing the transformation of the elastic contact part.

Figure 5A:
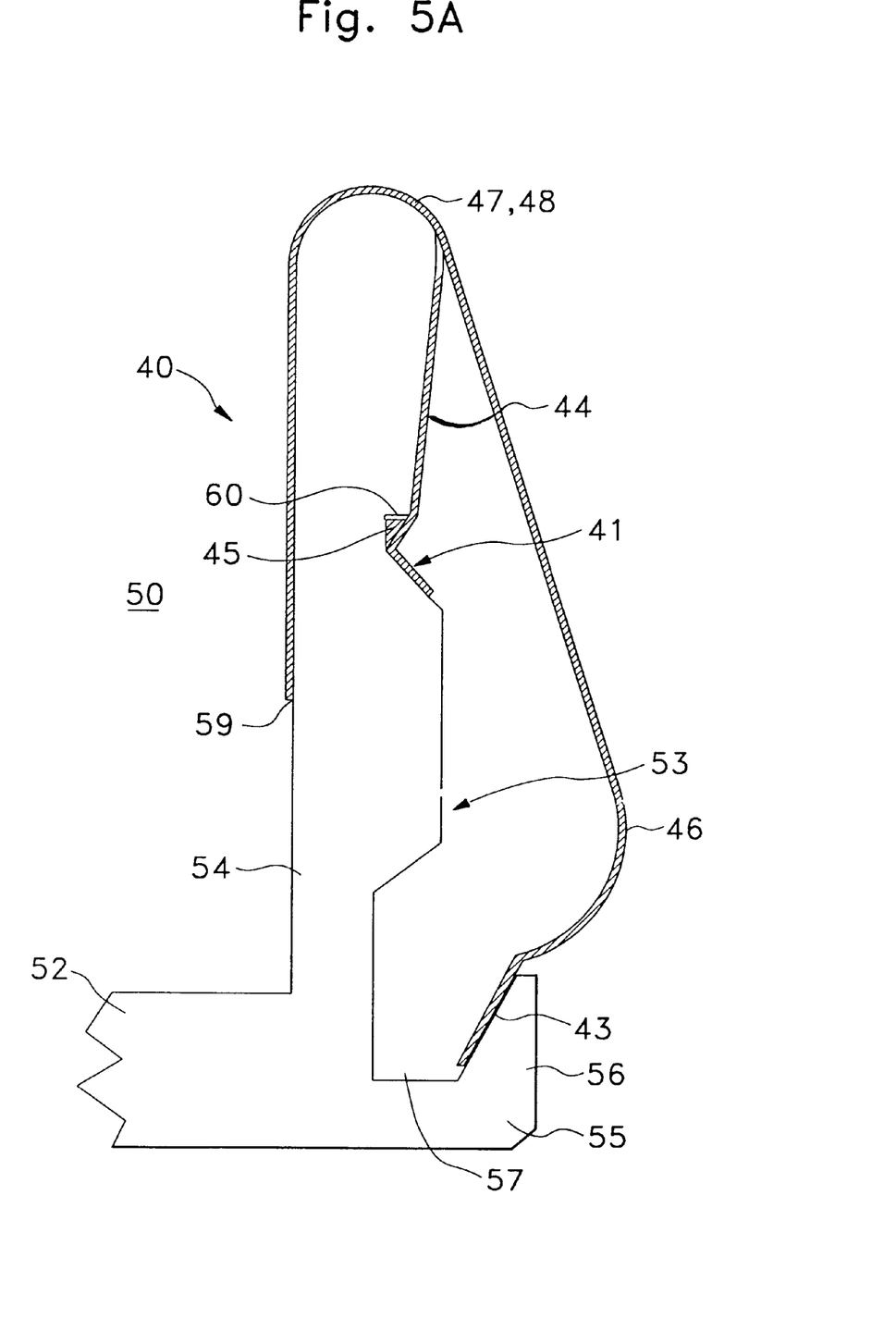
FIGS. 5A to 5C are sectional views showing another embodiments according to the present invention.
Figure 5B:
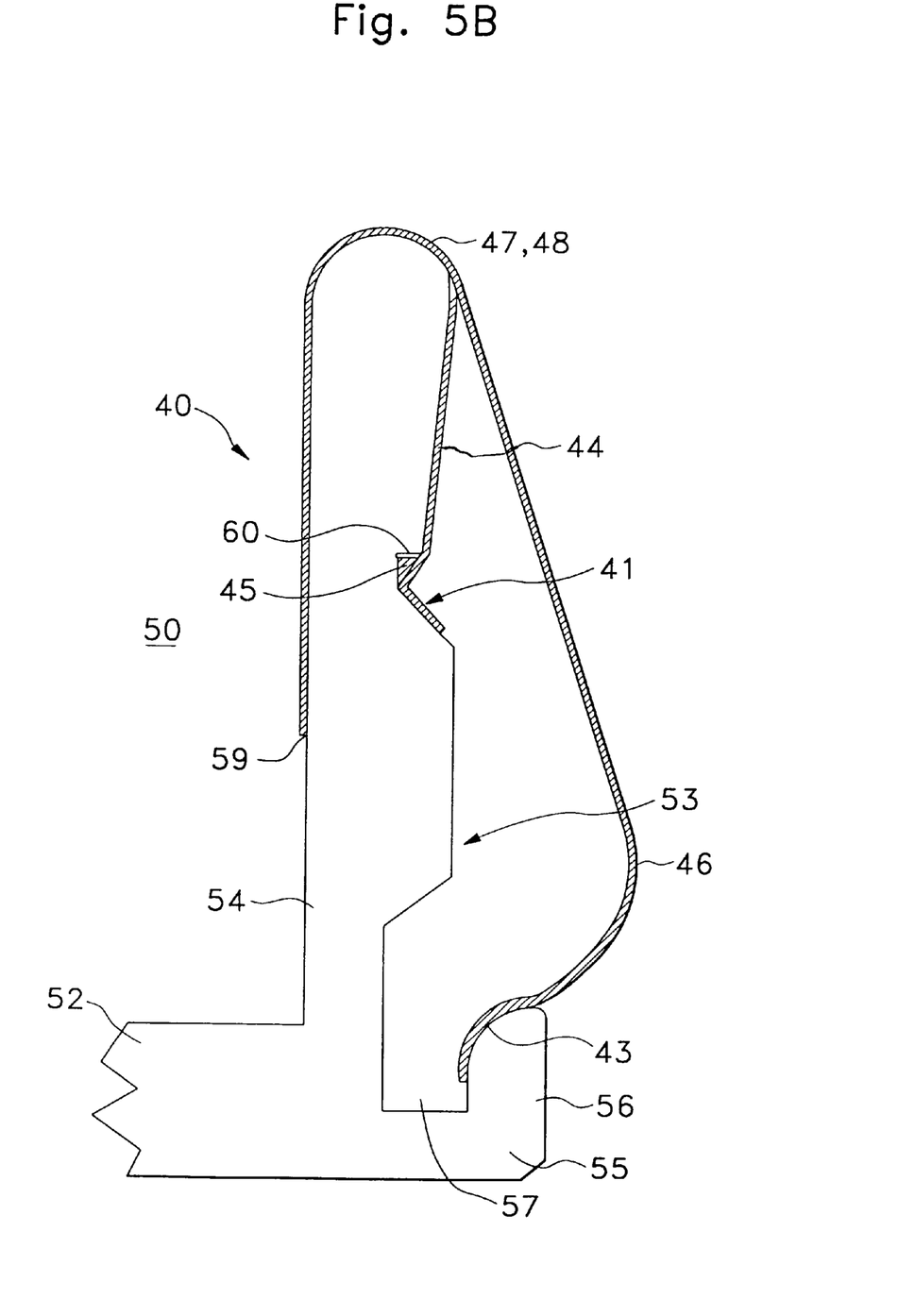
Figure 5C:
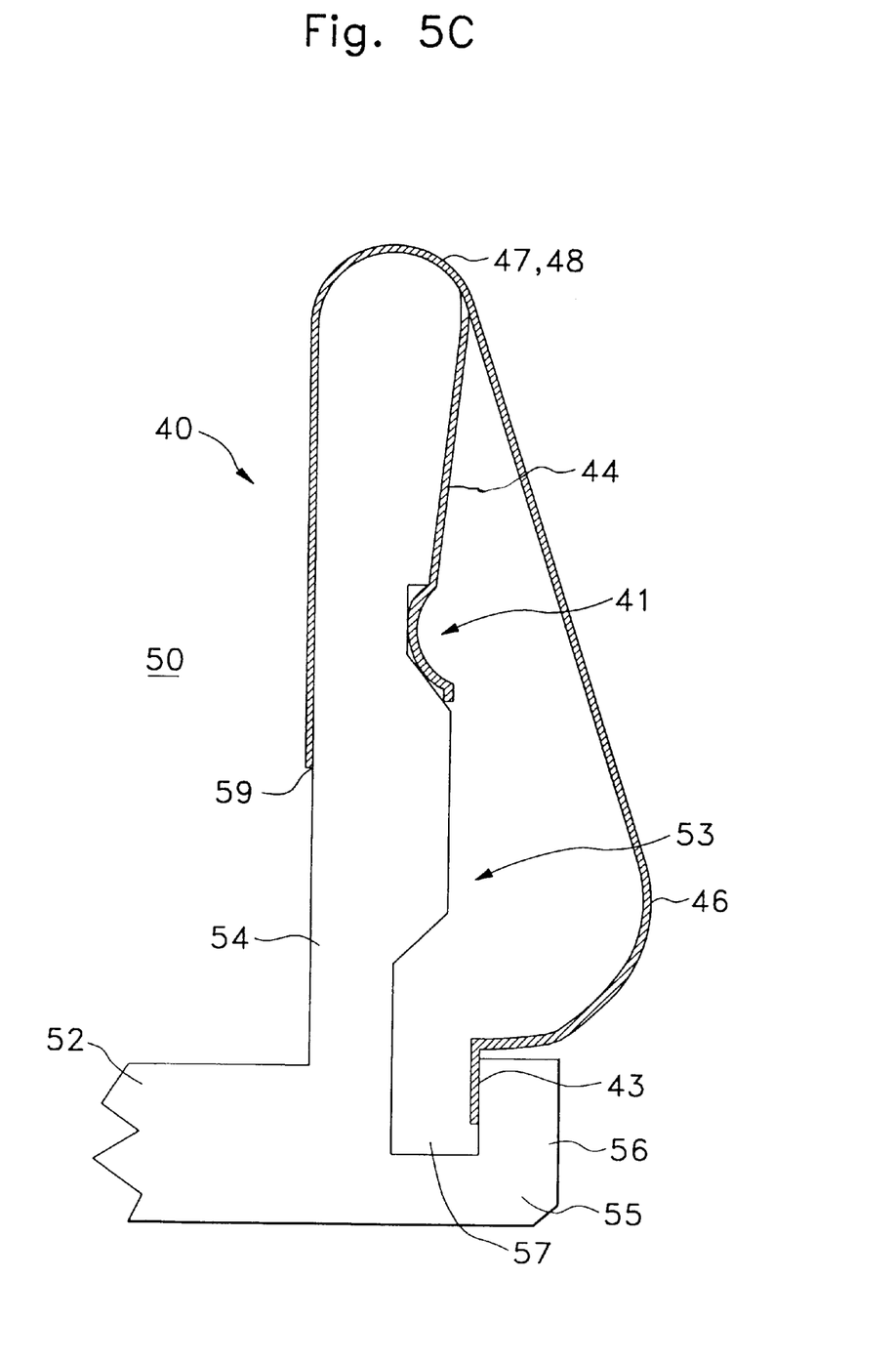

FIGS. 5A to 5C are embodiments showing the modifications of the present invention. The shape of the guide projection can be formed as shown in FIG. 5A, which one side of the guide projection has an inclination. Or, as shown in FIG. 5B, one side of the guide projection can have a predetermined curvature. At this time, the guide unit of the finger strip which is facing with the one side of the guide projection can be varied, suitably to the modifications. Moreover, as shown in FIG. 5C, the folding part of the finger strip can be formed like a shape of semicircle.

Although the preferred embodiments of the present invention have been illustrative purposes, those skilled in the art will appreciate that various modifications, additions and substitutions are possible, without departing from the disclosed for scope and spirit of the invention as disclosed in the accompanying claims.

What is claimed is:

1. A finger strip and a front panel assembly, comprising:
   a finger strip for fixing extended boards for the extended mudules and shielding the electromagnetic wave, including:
   a common base having a predetermined width and length; and
   a plurality of fingers connected with each other through said common base each of said fingers having supporting means which is connected by placing
   a first connecting part at one end of said common base and is prolonged to
   the other end of said common base, escape preventing means which is prolonged to said supporting means, an elastic contact part which is connected by placing a second connecting part at one end of said common base and is prolonged to the other end of said common base, and height maintaining means which is prolonged to said elastic contact part; and a front panel for mounting said finger strip, including:
   a front part;
   a first side wall part which is formed at one end of the front part; and
   a second side wall part, having;
   strip escape preventing means including a fixing body which
   is formed at the other end of said front part and is actually perpendicular to said front part and a recess which is formed at said fixing body; and
   strip height fixing means which is prolonged parallel to said front part and forms a predetermined space part together with said fixing body,
   wherein, said base, first and second connecting parts and supporting means are inserted into said fixing body, said escape preventing means is received by said recess, and said height maintaining means is received by said strip height fixing means.

2. The assembly of claim 1, wherein said escape preventing means includes folding part formed at the end of said supporting means.

3. The assembly of claim 2, further comprising a stopper formed at the folding part facing said base.

4. The assembly of claim 3, wherein said stopper is formed by pressing said folding part to be projected toward said common base.

5. The assembly of claim 4, wherein said recess has a predetermined step and said stopper is received by said recess.

6. The assembly of claim 4, wherein said folding part has a section shaped like a circular arc.

7. The assembly of claim 1, wherein said strip height fixing means includes a guide unit which is prolonged paralled to said front part and a guide projection which is vertically formed to said guide unit, and said height maintaining means has a predetermined length and is contacted on said guide projection by a predetermined force.

8. The assembly of claim 7, wherein said first side wall part has a section shaped like a scraper, as its outer side is shorter than its inner side.

* * * * *